United States Patent
Chen et al.

(10) Patent No.: US 7,109,114 B2
(45) Date of Patent: Sep. 19, 2006

(54) HDP-CVD SEASONING PROCESS FOR HIGH POWER HDP-CVD GAPFIL TO IMPROVE PARTICLE PERFORMANCE

(75) Inventors: Xiaolin Chen, San Jose, CA (US); Jason Bloking, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 201 days.

(21) Appl. No.: 10/841,582

(22) Filed: May 7, 2004

(65) Prior Publication Data

US 2005/0250340 A1    Nov. 10, 2005

(51) Int. Cl.
*H01L 21/44* (2006.01)

(52) U.S. Cl. .................. 438/680; 438/513; 438/905

(58) Field of Classification Search ................ 438/680, 438/513, 905, 906, 723, 743, 756, 788, 789, 438/798, 799
See application file for complete search history.

(56) References Cited

U.S. PATENT DOCUMENTS

| | | | |
|---|---|---|---|
| 4,340,462 A | 7/1982 | Koch | |
| 4,948,458 A | 8/1990 | Ogle | |
| 5,045,346 A | 9/1991 | Tabasky et al. | |
| 5,221,414 A | 6/1993 | Langley et al. | |
| 5,244,730 A | 9/1993 | Nguyen et al. | |
| 5,366,585 A | 11/1994 | Robertson et al. | |
| 5,589,233 A | 12/1996 | Law et al. | |
| 5,614,055 A | 3/1997 | Fairbairn et al. | |
| 5,647,953 A | 7/1997 | Williams et al. | |
| 5,860,770 A | 1/1999 | Rossman et al. | |
| 6,020,035 A | 2/2000 | Gupta et al. | |
| 6,486,081 B1 * | 11/2002 | Ishikawa et al. | ............ 438/788 |

FOREIGN PATENT DOCUMENTS

| | | |
|---|---|---|
| JP | 58-92217 | 6/1983 |
| JP | 58-92218 | 6/1983 |

OTHER PUBLICATIONS

U.S Appl. No. 08/234,746, Nowak et al.

* cited by examiner

*Primary Examiner*—David Nhu
(74) *Attorney, Agent, or Firm*—Townsend and Townsend and Crew LLP (57) ABSTRACT

A method of operating a substrate processing chamber that includes, prior to a substrate processing operation, flowing a seasoning gas comprising silane and oxygen into said chamber at a flow ratio of greater than or equal to about 1.6:1 oxygen to silane to deposit a silicon oxide film over at least one aluminum nitride nozzle exposed to an interior portion of the chamber. Also, a substrate processing system that includes a housing, a gas delivery system for introducing a seasoning gas into a vacuum chamber, where the gas delivery system comprises one or more aluminum nitride nozzles exposed to the vacuum chamber, a controller and a memory having a program having instructions for controlling the gas delivery system to flow a seasoning gas that has an oxygen to silane ratio greater than or equal to about 1.6:1 to deposit a silicon oxide film on the aluminum nitride nozzles.

17 Claims, 5 Drawing Sheets

HDP-CVD SEASONING PROCESS FOR HIGH POWER HDP-CVD GAPFIL TO IMPROVE PARTICLE PERFORMANCE

BACKGROUND OF THE INVENTION

During chemical vapor deposition (CVD) of silicon oxide and other layers onto the surface of a substrate, the deposition gases released inside the processing chamber may cause unwanted deposition on areas such as the walls of the processing chamber. Unless removed, this unwanted deposition is a source of particles that may interfere with subsequent processing steps and adversely affect wafer yield.

To avoid such problems, the inside surface of the chamber is regularly cleaned to remove the unwanted deposition material from the chamber walls and similar areas of the processing chamber. This procedure may be performed as a standard chamber dry clean operation where an etchant gas, such as nitrogen trifluoride ($NF_3$), is used to remove (etch) the deposited material from the chamber wall and other areas. During the dry clean operation, the chamber interior is exposed to a plasma from the etchant gas so that the etchant gas reacts with and removes the deposited material from the chamber walls. Such cleaning procedures are commonly performed between deposition steps for every wafer or every n wafers.

The clean step can, in itself, be a source of particle accumulation however. Fluorine from the clean plasma can be adsorbed and/or trapped in the chamber walls and in other areas of the chamber such as areas that include ceramic lining or other insulation materials. The trapped fluorine can be released during subsequent processing steps (e.g., by reacting with constituents from the plasma in a high density plasma CVD (HDP-CVD) step) and can be adsorbed in subsequently deposited silicon oxide layers.

To prevent such fluorine adsorption and to provide protection against other contaminants within the chamber walls (e.g., the diffusion of metal fluorides) a CVD chamber is often "seasoned" after the dry clean operation. Such seasoning includes depositing a thin silicon oxide layer over the chamber walls before a substrate is introduced into the chamber for processing. The deposited silicon oxide layer covers the chamber walls, reducing the likelihood that contaminants will interfere with subsequent processing steps. After deposition of the seasoning layer is complete, the chamber is used for 1 to n substrate deposition steps before being cleaned by another clean operation as described above and then reseasoned.

The dielectric properties of the seasoning layer also provide an insulating barrier that prevents electrical arcing between the plasma and the walls of the chambers. The chambers typically include conductive materials (e.g., metals), and when the electric potential of the plasma exceeds a threshold level it begins to ground itself by discharging through the exposed conductive surfaces of the chamber. This discharging can damage the chamber by ablating away parts of the conductive surface. Coating these exposed conductive surfaces with the seasoning film reduces (or prevents) plasma arcing.

A conventional method used to season deposition chambers includes the steps of forming a plasma from a process gas of silane ($SiH_4$), oxygen ($O_2$), and argon (Ar). In one particular implementation of this previously known method, the preferred flow ratio of oxygen to silane used in the method is 1.375:1. $O_2$ is introduced at 110 sccm, $SiH_4$ is introduced at 80 sccm and Ar is introduced at 20 sccm. This seasoning process has been used to protect subsequent processing steps form contaminants in the HDP-CVD chamber.

Semiconductor device geometries have dramatically decreased in size since such devices were first introduced decades ago. Today's wafer fabrication plants are routinely producing integrated circuits having 0.13 micron feature sizes and smaller.

As device sizes become smaller and integration density increases, issues that were not previously considered important by the industry are becoming a concern. Also, improved control over criteria such as particle generation and contaminant control is necessary to ensure that deposited layers meet stringent manufacturers specifications. In order to meet processing demands created by such small scale geometry devices, new technology for substrate processing equipment is constantly being developed.

Another trend in semiconductor fabrication is for a larger numbers of copies of an integrated circuit design to be formed on a single substrate. For example, the current industry standard is to form integrated circuits on circular silicon wafers having a 200 mm diameter. Current trends in the industry, however, favor forming ICs on larger, 300 mm diameter wafers. The larger wafers allow more copies of an IC to be fabricated in a single process than could be accommodated on the smaller 200 mm wafers.

However, the larger wafers can place extra demands on the fabrication chamber, including the need to operate the chamber at higher power to generate an adequate sized plasma for depositing a film on the larger substrate. The higher operating powers can heat-up chamber components to temperatures that may hit or exceed high-temperature thresholds for those components. Thus, there is a need for components that can operate in the high power environments used with larger substrates that also have the low particle generation characteristics needed for efficient production of today's densely packed ICs.

BRIEF SUMMARY OF THE INVENTION

An embodiment of the invention includes a method of operating a substrate processing chamber. The method includes the steps of, prior to a substrate processing operation, flowing a seasoning gas that includes silane and oxygen into said chamber at a flow ratio of greater than or equal to about 1.6:1 oxygen to silane to deposit a silicon oxide film over at least one aluminum nitride nozzle exposed to an interior portion of the chamber.

Another embodiment of the invention includes a substrate processing system. The system includes a housing for forming a vacuum chamber having an interior surface, and a gas delivery system for introducing a seasoning gas into said vacuum chamber, where the gas delivery system comprises one or more aluminum nitride nozzles exposed to the vacuum chamber. The system also includes a controller, operatively coupled to control said gas delivery system, and a memory operatively coupled to said controller, including a computer-readable medium having a computer-readable program embodied therein for directing operation of said processing system. The computer-readable program include a set of instructions for, prior to a substrate processing operation, controlling said gas delivery system to flow a seasoning gas that has an oxygen to silane ratio greater than or equal to about 1.6:1 to deposit a silicon oxide film on the aluminum nitride nozzles.

Another embodiment of the invention includes a method of fabricating an integrated circuit. The method includes the steps of providing a substrate processing chamber having an interior surface, and cleaning at least one interior surface of the chamber by introducing an etchant gas into said chamber. The method also includes the steps of flowing a seasoning gas comprising oxygen and silane at a flow ratio greater than or equal to 1.6:1 oxygen to silane into the chamber, and striking a plasma from said seasoning gas to deposit a silicon oxide film over at least one aluminum nitride nozzle exposed to an interior portion of the chamber. The method further includes transferring a substrate upon which the integrated circuit is formed into the chamber, and forming a deposited layer on the substrate.

Additional features are set forth in part in the description that follows, and in part will become apparent to those skilled in the art upon examination of the following specification or may be learned by the practice of the invention. The features and advantages of the invention may be realized and attained by means of the instrumentalities, combinations, and methods particularly pointed out in the appended claims.

DETAILED DESCRIPTION OF THE INVENTION

As noted above, the amount of power used to generate plasmas in substrate deposition chambers has increased substantially as substrates get larger. For example, depositing films on 200 mm diameter substrate wafers typically required plasma generation systems (e.g., RF generators) to operate at about 4500 watts. Newer 300 mm diameter substrate wafers, however, have more surface area to cover and typically require plasma generation systems to run at about 7000 to about 9000 watts, and sometimes higher powers. The increase in power can cause components inside the chamber to reach and exceed their threshold high-temperature operating limits.

Embodiments of the present invention address problems associated with high-temperature heating (and sometimes overheating) of chamber components by using materials with higher thermal conductivities. These materials are able to conduct thermal energy away from the heating components faster than conventional materials, which allows them to maintain a lower temperature even as the RF power in the chamber is increased.

One high thermal conductivity material used in embodiments of the invention is Aluminum Nitride (AlN), which has a thermal conductivity, K=70 watts/(meter kelvin). AlN has a substantially higher thermal conductivity than conventional alumina ($Al_2O_3$), with K=19 W/m K. The higher thermal conductivity of AlN can translate into substantially lower operating temperatures for components made from the ceramic compared to the same component made from alumina. For example, a conventional alumina nozzle for delivering fluids to an interior portion of the chamber typically reaches temperatures of about 750° C. or more during plasma deposition on 300 mm substrates, while the same nozzle made of AlN operates at about 316° C. Such a difference in operating temperatures makes AlN a more suitable material for chamber components (e.g., nozzles, baffles, etc.) in many high power substrate deposition operations.

While the use of AlN in chamber components solves problems with overheating components, it creates additional problems addressed by the present invention. These problems include the relatively poor performance of conventional seasoning films in adhering to AlN. As noted above, seasoning films are deposited on the interior of a chamber after a chamber cleaning process to prevent particles from the chamber interior (e.g., cleaning residue) from contaminating the substrate during substrate film deposition. The seasoning film traps particles preventing them from falling onto the substrate (and the films deposited on the substrate).

Conventional seasoning films are typically formed from a seasoning gas that includes oxygen ($O_2$) and silane ($SiH_4$) flowing into the chamber in a ratio of about 1.4 to 1 or less. A pre-heating step of 15 seconds or less is also sometimes performed prior to the introduction of the seasoning gas. The resulting films adhere poorly to AlN components and may start flaking off, contributing to the particle contamination of the substrate. For example, a conventionally formed seasoning film can generate about 200 or more particle adders (having sizes greater than 0.20 μm) on a 300 mm diameter substrate.

Embodiments of the present invention include methods of forming seasoning films with improved adherence to AlN and other high thermal conductivity materials. These embodiments include a pre-heating step of about 30 second or longer and increasing the oxygen to silane ratio in the seasoning gas to about 1.6 to 1 or more. The resulting seasoning films formed on the chamber components have less flaking and generate fewer particle adders than conventional seasoning films.

Exemplary Substrate Processing System

Figure 1A:
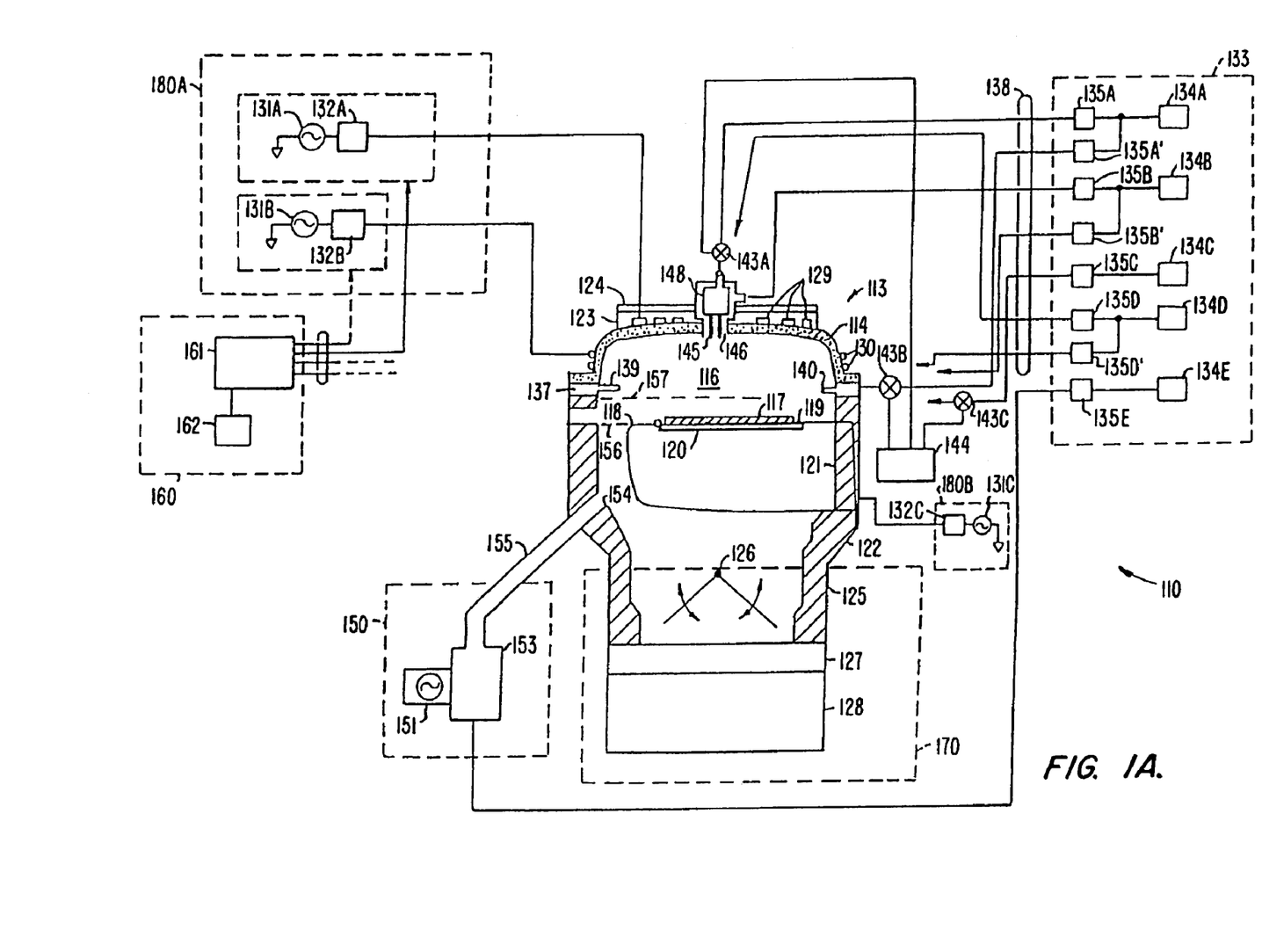
FIG. 1A is a simplified diagram of one embodiment of a high density chemical vapor deposition system according to the present invention.

Referring now to FIG. 1A, an embodiment of a high density plasma chemical vapor deposition (HDP-CVD) system 110 in which a seasoning film according to the present invention may be deposited on the aluminum nitrate components (e.g., nozzles, baffles, etc.). System 110 includes a chamber 113, a vacuum system 170, a source plasma system 180A, a bias plasma system 180B, a gas delivery system 133, and a remote plasma cleaning system 150.

The upper portion of chamber 113 includes a dome 114, which is made of a ceramic dielectric material, such as aluminum nitride. Dome 114 defines an upper boundary of a plasma processing region 116. Plasma processing region 116 is bounded on the bottom by the upper surface of a substrate 117 and a substrate support member 118.

A heater plate 123 and a cold plate 124 surmount, and are thermally coupled to, dome 114. Heater plate 123 and cold plate 124 allow control of the dome temperature to within about +/−10° C. over a range of about 100° C. to about 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 113 includes a body member 122, which joins the chamber to the vacuum system. A base portion 121 of substrate support member 118 is mounted on, and forms a continuous inner surface with, body member 122. Substrates are transferred into and out of chamber 113 by a robot blade (not shown) through an insertion/removal opening (not shown) in the side of chamber 113. Lift pins (not shown) are raised and then lowered under the control of a motor (also not shown) to move the substrate from the robot blade at an upper loading position 157 to a lower processing position 156 in which the substrate is placed on a substrate receiving portion 119 of substrate support member 118. Substrate receiving portion 119 includes an electrostatic chuck 120 that secures the substrate to substrate support member 118 during substrate processing. In one embodiment, substrate support member 118 is made from an aluminum ceramic (e.g., AlN) material.

Vacuum system 170 includes throttle body 125, which houses twin-blade throttle valve 126 and is attached to gate valve 127 and turbo-molecular pump 128. It should be noted that throttle body 125 offers minimum obstruction to gas flow, and allows symmetric pumping, as described in co-assigned U.S. patent application Ser. No. 08/574,839, filed Dec. 12, 1995, and which is incorporated herein by reference. Gate valve 127 can isolate pump 128 from throttle body 125, and can also control chamber pressure by restricting the exhaust flow capacity when throttle valve 126 is fully open. The arrangement of the throttle valve, gate valve, and turbo-molecular pump allow accurate and stable control of chamber pressures from between about 1 mTorr to about 2 Torr.

The source plasma system 180A includes a top coil 129 and side coil 130, mounted on dome 114. A symmetrical ground shield (not shown) reduces electrical coupling between the coils. Top coil 129 is powered by top source RF (SRF) generator 131A, whereas side coil 130 is powered by side SRF generator 131B, allowing independent power levels and frequencies of operation for each coil. This dual coil system allows control of the radial ion density in chamber 113, thereby improving plasma uniformity. Side coil 130 and top coil 129 are typically inductively driven, which does not require a complimentary electrode. In one embodiment, the top source RF generator 131A provides up to 10,000 watts of RF power at nominally 2 MHz and the side source RF generator 131B provides up to 10,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 180B includes a bias RF (BRF) generator 131C and a bias matching network 132C. The bias plasma system 180B capacitively couples substrate portion 117 to body member 122, which act as complimentary electrodes. The bias plasma system 180B serves to enhance the transport of plasma species (e.g., ions) created by the source plasma system 180A to the surface of the substrate. In a specific embodiment, bias RF generator provides up to 5,000 watts of RF power at 13.56 MHz.

RF generators 131A and 131B include digitally-controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 132 and 132B match the output impedance of generators 131A and 131B with their respective coils 129 and 130. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 1B:
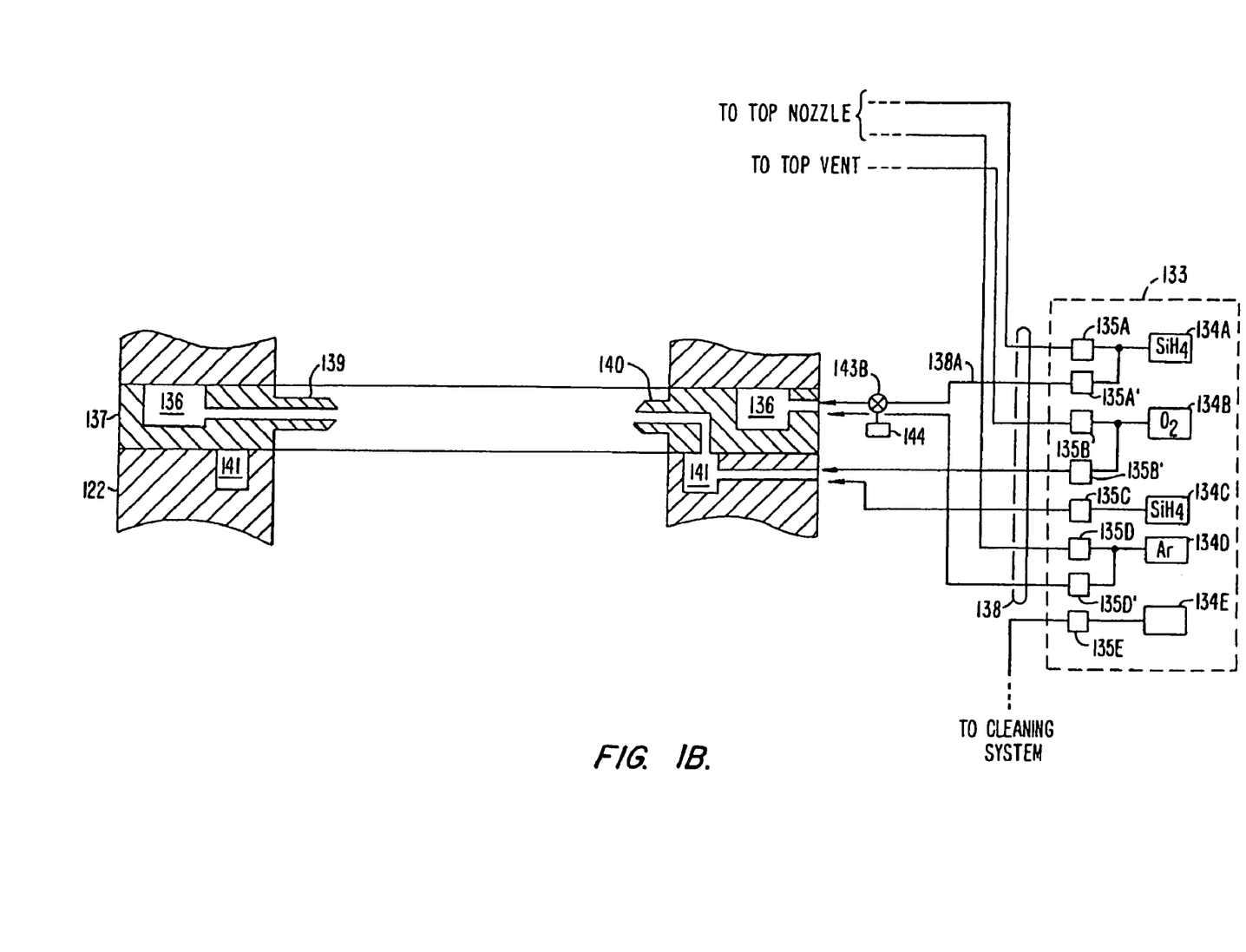
FIG. 1B is a simplified cross section of a gas ring that may be used in conjunction with the exemplary CVD processing chamber of FIG. 1A.

A gas delivery system 133 provides gases from several sources, 134A–134F chamber for processing the substrate via gas delivery lines 138 (only some of which are shown). As would be understood by a person of skill in the art, the actual sources used for sources 134A–134F and the actual connection of delivery lines 138 to chamber 113 varies depending on the deposition and cleaning processes executed within chamber 113. Gases are introduced into chamber 113 through a gas ring 137 and/or a top nozzle 145. The gas ring 137 and/or top nozzle 145 may be made from AlN. FIG. 1B is a simplified, partial cross-sectional view of chamber 113 showing additional details of gas ring 137.

In one embodiment, first and second gas sources, 134A and 134B, and first and second gas flow controllers, 135A' and 135B', provide gas to ring plenum 136 in gas ring 137 via gas delivery lines 138 (only some of which are shown). Gas ring 137 has a plurality of gas nozzles 139 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In one embodiment, gas ring 137 has one hundred twelve gas nozzles 139 made from aluminum nitride.

Gas ring 137 also has a plurality of gas nozzles 140 (only one of which is shown), which may be co-planar with and shorter than source gas nozzles 139, and in one embodiment receive gas from body plenum 141. Gas nozzles 140 may be made from AlN. Gas nozzles 139 and 140 are not fluidly coupled in some embodiments it is desirable not to mix gases before injecting the gases into chamber 113. In other embodiments, gases may be mixed prior to injecting the gases into chamber 113 by providing apertures (not shown) between body plenum 141 and gas ring plenum 136. In one embodiment, third and fourth gas sources, 134C and 134D, and third and fourth gas flow controllers, 135C and 135D', provide gas to body plenum via gas delivery lines 138. Additional valves, such as 143B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 143B, to isolate chamber 113 from delivery line 138A and to vent delivery line 138A to vacuum foreline 144, for example. As shown in FIG. 1A, other similar valves, such as 143A and 143C, may be incorporated on other gas delivery lines. Such 3-way valves may be placed as close to chamber 113 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 1A, chamber 113 also has top nozzle 145 (which may be made from AlN) and top vent 146. Top nozzle 145 and top vent 146 allow independent control of top and side flows of the gases, which improves film uniformity and allows fine adjustment of the film's deposition and doping parameters. Top vent 146 is an annular opening around top nozzle 145. In one embodiment, first gas source 134A supplies source gas nozzles 139 and top nozzle 145. Source nozzle MFC 135A' controls the amount of gas delivered to source gas nozzles 139 and top nozzle MFC 135A controls the amount of gas delivered to top gas nozzle 145. Similarly, two MFCs 135B and 135B' may be used to control the flow of oxygen to both top vent 146 and oxidizer gas nozzles 140 from a single source of oxygen, such as source 134B. The gases supplied to top nozzle 145 and top vent 146 may be kept separate prior to flowing the gases into chamber 113, or the gases may be mixed in top plenum 148 before they flow into chamber 113. Separate sources of the same gas may be used to supply various portions of the chamber.

A remote microwave-generated plasma cleaning system 150 is provided to periodically clean deposition residues from chamber components. The cleaning system includes a remote microwave generator 151 that creates a plasma from a cleaning gas source 134E (e.g., molecular fluorine, nitrogen trifluoride, other fluorocarbons or equivalents) in reactor cavity 153. The reactive species resulting from this plasma are conveyed to chamber 113 through cleaning gas feed port 154 via applicator tube 155. The materials used to contain the cleaning plasma (e.g., cavity 153 and applicator tube 155) should be resistant to attack by the plasma. The distance between reactor cavity 153 and feed port 154 should be kept as short as practical, since the concentration of desirable plasma species may decline with distance from reactor cavity 153. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 120, do not need to be covered with a dummy wafer or otherwise protected, as may be required with an in situ plasma cleaning process.

System controller 160 controls the operation of system 110. Controller 160 may include a memory 162, such as a hard disk drive, a floppy disk drive (not shown), and a card rack (not shown) coupled to a processor 161. The card rack may contain a single-board computer (SBC) (not shown), analog and digital input/output boards (not shown), interface boards (not shown), and stepper motor controller boards (not shown). The system controller conforms to the Versa Modular European (VME) standard, which defines board, card cage, and connector dimensions and types. The VME standard also defines the bus structure as having a 16-bit data bus and 24-bit address bus. System controller 131 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube (CRT) 165, and a light pen 166, as depicted in FIG. 1C.

Figure 1C:
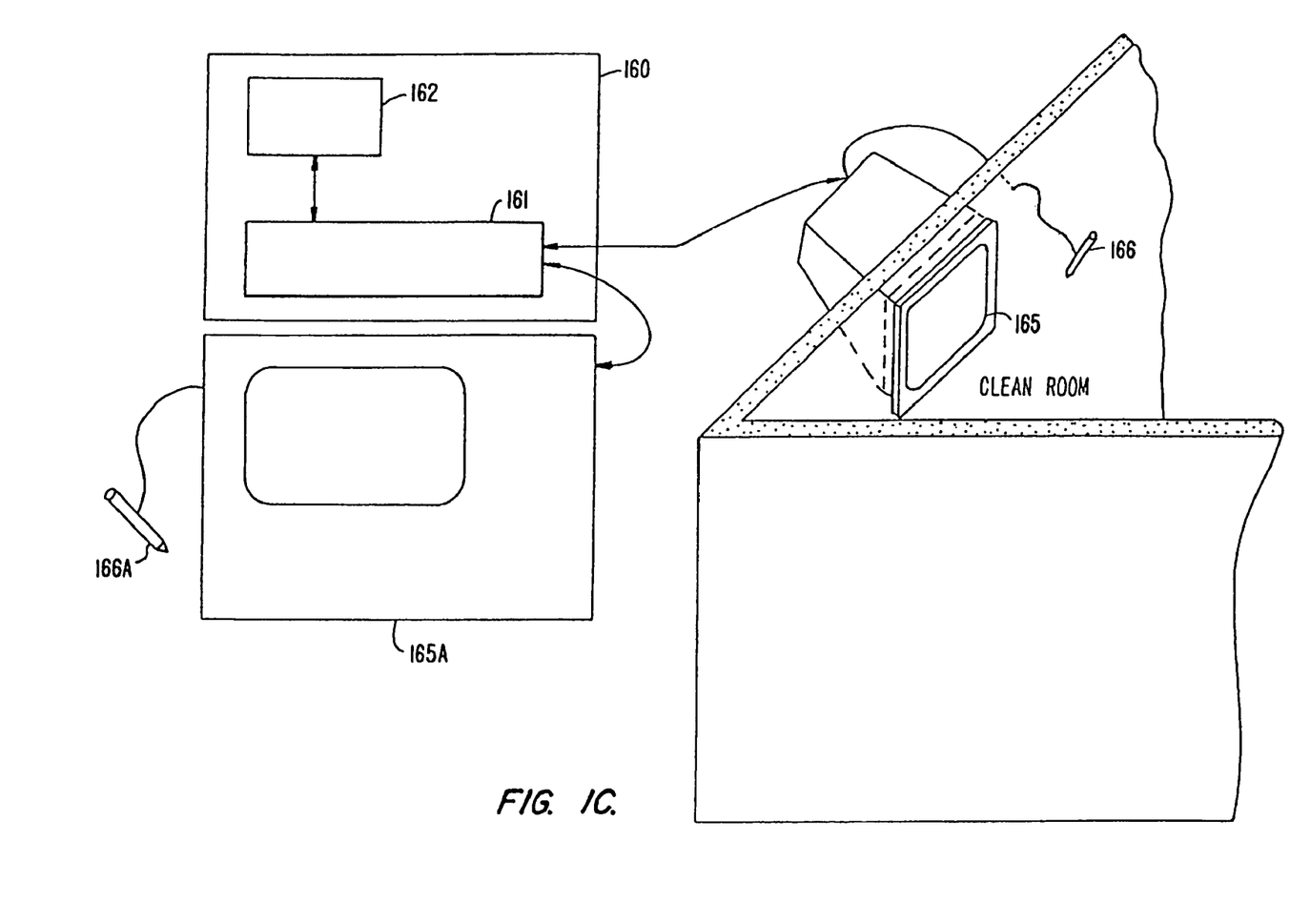
FIG. 1C is a simplified diagram of a monitor and light pen that may be used in conjunction with the exemplary CVD processing chamber of FIG. 1A.

FIG. 1C is an illustration of a portion of an exemplary system user interface used in conjunction with the exemplary CVD processing chamber of FIG. 1A. System controller 160 includes a processor 161 coupled to a computer-readable memory 162. Preferably, memory 162 may be a hard disk drive, but memory 162 may be other kinds of memory, such as ROM, PROM, and others.

System controller 160 operates under the control of a computer program 163 stored in a computer-readable format within memory 162. The computer program dictates the timing, temperatures, gas flows, RF power levels and other parameters of a particular process. The interface between a user and the system controller is via a CRT monitor 165 and a light pen 166, as depicted in FIG. 1C. Two monitors, 165 and 165A, and two light pens, 166 and 166A, may be used, one mounted in the clean room wall (165) for the operators and the other behind the wall (165A) for the service technicians. Both monitors simultaneously display the same information, while one light pen (e.g. 166) may be enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer-readable programming language such as 68000 assembly language, C, C++, Java, and Pascal, among others. Suitable program code is entered into a single file, or multiple files, using a conventional text editor and is stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 1D:
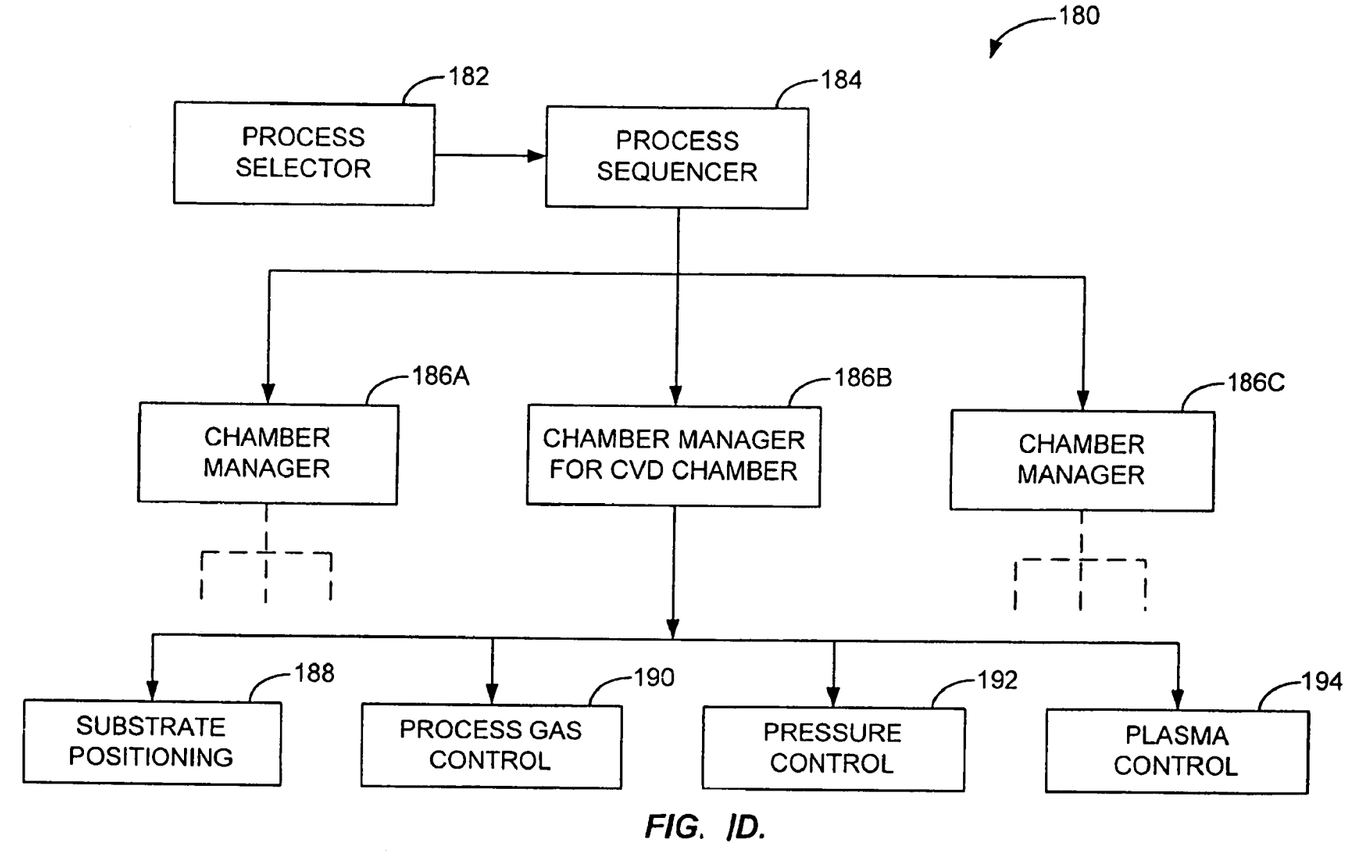
FIG. 1D is a flow chart of an exemplary process control computer program product used to control the exemplary CVD processing chamber of FIG. 1A.

FIG. 1D shows an illustrative block diagram of the hierarchical control structure of computer program 180. A user enters a process set number and process chamber number into a process selector subroutine 182 in response to menus or screens displayed on the CRT monitor by using the light pen interface. The process sets are predetermined sets of process parameters necessary to carry out specified processes, and are identified by predefined set numbers. Process selector subroutine 182 identifies (i) the desired process chamber in a multichamber system, and (ii) the desired set of process parameters needed to operate the process chamber for performing the desired process. The process parameters for performing a specific process relate to conditions such as process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog and digital input boards of system controller 160, and the signals for controlling the process are output on the analog and digital output boards of system controller 160.

A process sequencer subroutine 184 comprises program code for accepting the identified process chamber and set of process parameters from the process selector subroutine 182 and for controlling operation of the various process chambers. Multiple users can enter process set numbers and process chamber numbers, or a single user can enter multiple process set numbers and process chamber numbers; sequencer subroutine 184 schedules the selected processes in the desired sequence. Preferably, sequencer subroutine 184 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 184 can be designed to take into consideration the "age of each particular user-entered request, or the present condition of the process chamber being used in comparison with the desired process conditions for a selected process, or any other relevant factor a system programmer desires to include for determining scheduling priorities.

After sequencer subroutine 184 determines which process chamber and process set combination is going to be executed next, sequencer subroutine 184 initiates execution of the process set by passing the particular process set parameters to a chamber manager subroutine 186A–C, which controls multiple processing tasks in chamber 113 and possibly other chambers (not shown) according to the process set sent by sequencer subroutine 184.

Examples of chamber component subroutines are substrate positioning subroutine 188, process gas control subroutine 190, pressure control subroutine 192, and plasma control subroutine 194. Those having ordinary skill in the art will recognize that other chamber control subroutines can be included depending on what processes are selected to be performed in chamber 113. In operation, chamber manager subroutine 186B selectively schedules or calls the process component subroutines in accordance with the particular process set being executed. Chamber manager subroutine 186B schedule process component subroutines in the same manner that sequencer subroutine 184 schedules the process chamber and process set to execute. Typically, chamber manager subroutine 186B includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 1A and 1D. Substrate positioning subroutine 188 comprises program code for controlling chamber components that are used to load a substrate onto substrate support number 118. Substrate positioning subroutine 188 may also control transfer of a substrate into chamber 113 from, e.g., a PECVD reactor or other reactor in the multi-chamber system, after other processing has been completed.

Process gas control subroutine 190 has program code for controlling process gas composition and flow rates. Subroutine 190 controls the open/close position of the safety shut-off valves and also ramps up/ramps down the mass flow controllers to obtain the desired gas flow rates. All chamber component subroutines, including process gas control subroutine 190, are invoked by chamber manager subroutine 186B. Subroutine 190 receives process parameters from chamber manager subroutine 186B related to the desired gas flow rates.

Typically, process gas control subroutine 190 opens the gas supply lines, and repeatedly (i) reads the necessary mass flow controllers, (ii) compares the readings to the desired flow rates received from chamber manager subroutine 186B, and (iii) adjusts the flow rates of the gas supply lines as necessary. Furthermore, process gas control subroutine 190 may include steps for monitoring the gas flow rates for unsafe rates and for activating the safety shut-off valves when an unsafe condition is detected.

In some processes, an inert gas, such as argon, is flowed into chamber 113 to stabilize the pressure in the chamber before reactive process gases are introduced. For these processes, the process gas control subroutine 190 is programmed to include steps for flowing the inert gas into chamber 113 for an amount of time necessary to stabilize the pressure in the chamber. The steps described above may then be carried out.

Additionally, when a process gas is to be vaporized from a liquid precursor, for example, tetraethylorthosilane (TEOS), the process gas control subroutine 190 may include steps for bubbling a delivery gas such as helium through the liquid precursor in a bubbler assembly or for introducing the helium to a liquid injection valve. For this type of process, the process gas control subroutine 190 regulates the flow of the delivery gas, the pressure in the bubbler, and the bubbler temperature to obtain the desired process gas flow rates. As discussed above, the desired process gas flow rates are transferred to process gas control subroutine 190 as process parameters.

Furthermore, the process gas control subroutine 190 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 190 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 192 includes program code for controlling the pressure in chamber 113 by regulating the size of the opening of throttle valve 126 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 126 to a fixed position. Setting throttle valve 126 to a fixed position may eventually result in a steady-state pressure.

Alternatively, the chamber pressure may be measured, with a manometer for example, and the position of throttle valve 126 may be adjusted according to pressure control subroutine 192, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 192 is invoked, the desired, or target, pressure level is received as a parameter from chamber manager subroutine 186B. Pressure control subroutine 192 measures the pressure in chamber 113 by reading one or more conventional pressure manometers connected to the chamber; compares the measured value(s) to the target pressure; obtains proportional, integral, and differential (PID) values from a stored pressure table corresponding to the target pressure, and adjusts throttle valve 126 according to the PID values obtained from the pressure table. Alternatively, pressure control subroutine 192 may open or close throttle valve 126 to a particular opening size to regulate the pressure in chamber 113 to a desired pressure or pressure range.

Plasma control subroutine 194 comprises program code for controlling the frequency and power output setting of RF generators 131A and 131B and for tuning matching networks 132A and 132B. Plasma control subroutine 194, like the previously described chamber component subroutines, is invoked by chamber manager subroutine 186B.

An example of a system that may incorporate some or all of the subsystems and routines described above would be the ULTIMA™ system, manufactured by APPLIED MATERIALS, INC., of Santa Clara, Calif., configured to practice the present invention. The described system is for exemplary purpose only. It would be a matter of routine skill for a person of skill in the art to select an appropriate conventional substrate processing system and computer control system to implement the present invention. The gas flow rates, RF values and other parameters discussed above are based on processes employed in an Ultima HDP-CVD chamber outfitted for 200 mm or 300 mm substrate wafers. These values are in part chamber specific and may vary if chambers of other design and/or volume are used.

Exemplary Seasoning Process

Figure 2:
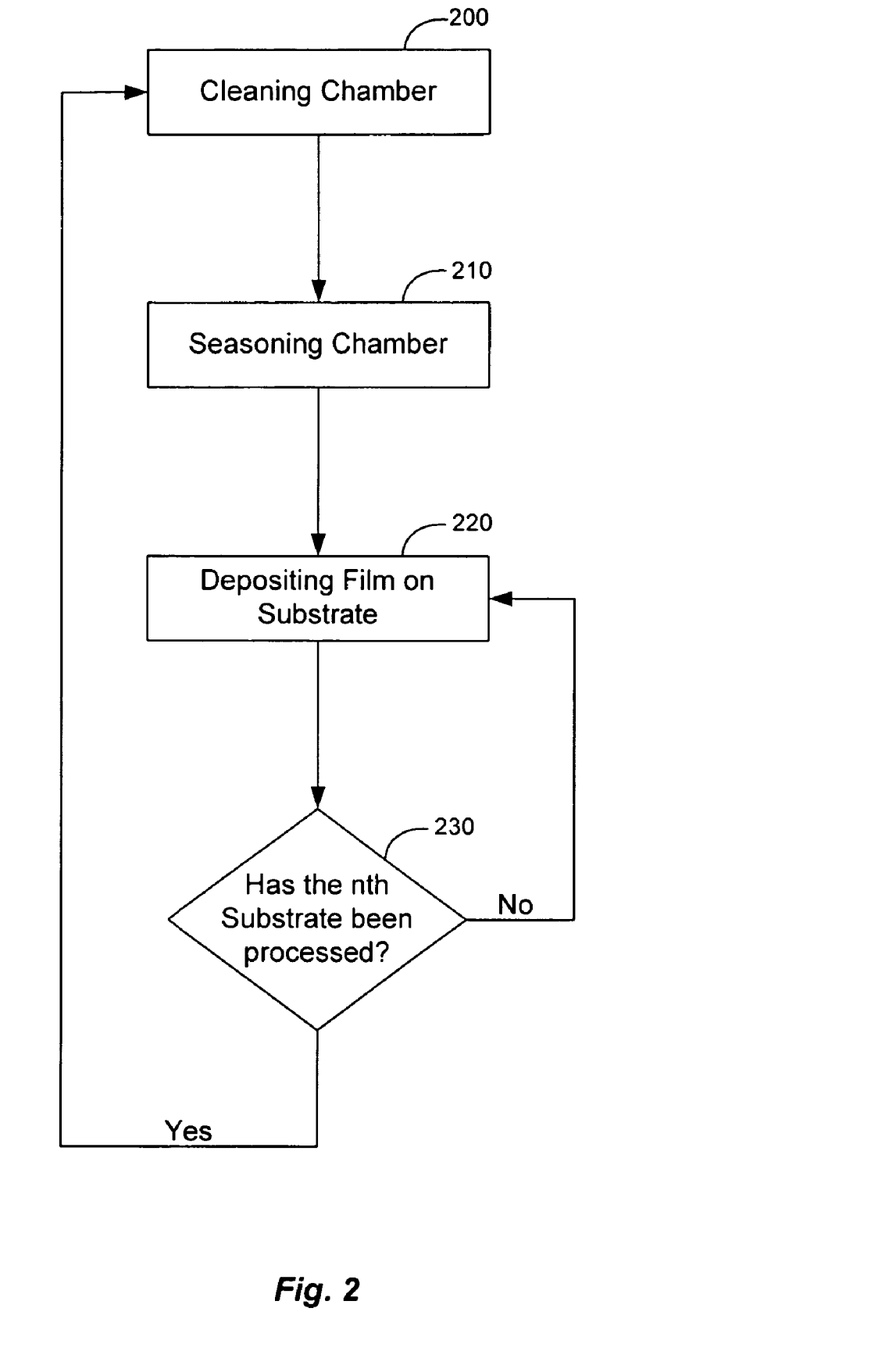
FIG. 2 is a flow chart illustrating the process used to form a seasoning film according to an embodiment of the present invention.

FIG. 2 illustrates a process to season a substrate processing chamber according to embodiments of the invention. The process may be implemented and controlled using a computer program stored in memory 62 of CVD system 10 shown in FIG. 1A. As shown in the flowchart, seasoning layer may be deposited after completion of a standard chamber clean operation 200 in which an etchant gas (e.g., $NF_3$) is introduced into chamber 13 to remove material deposited on the chamber walls from a previous processing step (e.g., CVD deposition operations 220). Cleaning operation 200 may leave residue (e.g., fluorine adsorbed in the chamber walls) inside chamber 13 that may be covered by the seasoning film to prevent it from contaminating substrate films during subsequent substrate deposition steps 220. After the seasoning film is deposited, 1 to n substrates may be processed 230 in chamber 13 before the cleaning seasoning operations (200 and 210) are repeated.

The seasoning layer is deposited in operation 210 by forming a plasma from a gas that includes silane ($SiH_4$), oxygen ($O_2$) and argon (Ar). The plasma is formed by application of RF energy like that generated by SRF generators 32A and 32B shown in FIG. 1A. In some embodiments, the plasma is not biased towards the substrate, and BRF generator 32C is kept off.

In seasoning operation 210, a number of seasoning film deposition parameters should be considered that assist the seasoning film in adhering to the interior of chamber 13. These deposition parameters may include: temperature, pressure, RF power level (or levels), the argon to oxygen ratio, and the oxygen to silane ratio, among other parameters. Controlling the oxygen to silane ratio has an effect on the composition of the seasoning film, which affects the ability of the film to adhere to the interior of chamber 13. While not wishing to be bound to a particular theory, an overly silicon rich seasoning film resulting from too low an oxygen to silane ratio forms a film with too many Si—H bonds and poor chamber wall adhesion characteristics. An overly oxygen rich seasoning film resulting from too high an oxygen to silane ratio forms a film with too many Si—OH bonds, which also has poor chamber wall adhesion characteristics.

According to embodiments of the present invention, a seasoning film formed with an oxygen to silane ratio from about 1.6:1 to about 2.4:1 has good adhesion characteristics for chamber components made from silicon nitride (e.g., nozzles, baffles, etc.) compared with conventional seasoning films made with and oxygen to silane ratio of 1.4:1 or lower. Other embodiments of the invention form a seasoning film with an oxygen to silane ratio from about 1.6:1 to about 2.2:1.

Embodiments of the invention also control the amount of gases other than oxygen and silane that are used in seasoning operation 210. For example, gases such as argon, helium and/or hydrogen may accompany the oxygen and silane into chamber 13 to form the seasoning film. The relative amounts of these gases may also effect the adhesion characteristics of the seasoning film. Increasing argon flow, for example, increases the plasma density, which can make a more effective seasoning film. However, too much argon may increase the chamber pressure to the point where the plasma density is reduced rather than increased, decreasing the effectiveness of the seasoning film. In embodiments of the invention, an argon flow rate is set about equal to the silane flow rate.

EXAMPLES

Examples will now be described of forming and testing seasoning films according to embodiments of the invention. In Example 1, a comparison is made of the number of particles added to a substrate from a conventional seasoning film and seasoning films according to embodiments of the invention. Particles from the seasoning film (referred to as particle adders) greater than 0.20 micrometers were counted on 200 mm substrate wafers after a heating process was performed The heating process includes striking and maintaining a plasma for 45 to 60 seconds with an RF power of about 4800 watts. The plasma is formed from oxygen ($O_2$) and argon.

The conventional seasoning film was formed on inside surfaces of an ULTIMA™ chamber (including aluminum nitride nozzles) through a conventional film forming process. This process included flowing 290 sccm-of oxygen ($O_2$), 180 sccm of silane ($SiH_4$), and 110 sccm of argon into the chamber from aluminum nitride nozzles positioned on the sides of the chamber. A plasma was struck for about 25 seconds to form the conventional seasoning film on the interior of the chamber (including the aluminum nitride nozzles). Prior to depositing the seasoning film, a 30 second heat-up step was performed. The heat-up step including striking a plasma from oxygen and argon using RF power of 4000 watts (top) and 3000 watts (side).

The seasoning films according to embodiments of the invention were form by processes according to the invention. This process included, after a heat-up period, flowing 350 sccm of oxygen ($O_2$), 160 sccm of silane ($SiH_4$), and 110 sccm of argon into the chamber from the side positioned AlN nozzles. In addition, silane having a flow rate of about 15 sccm was flowed into the chamber from an aluminum nitride nozzle positioned at the top of the chamber that adds the silane from above. A plasma was struck for about 25 seconds to form the seasoning film on the interior of the chamber (including the aluminum nitride nozzles).

Following the seasoning step, a 200 mm substrate wafer was introduced into the chamber and a deposition step was performed. After the deposition, particle adders where counted on the substrate. Table 1 below shows the particle adder results from the conventional seasoning film and the seasoning films made according the present invention after three different heat-up periods (15 sec, 30 sec and 45 sec). The wafers were observed after three sets of unmeasured wafer clean/season/deposition cycles (at 4 wafers/cycle) that were performed to stabilize the chamber. Thus, the first wafer measured was the 13th wafer run through the chamber.

TABLE 1

Particle Adders Found on 200 mm Wafers

| Process Conditions | Particle Adders >0.20 µm | | | |
|---|---|---|---|---|
| | Wafer 13 | Wafer 14 | Wafer 15 | Wafer 16 |
| Heat-Up: 15 sec<br>$O_2$: 350 sccm<br>$SiH_4$: 160 sccm<br>(sides); 15 sccm (top) | 94 | 84 | 40 | 22 |
| Heat-Up: 30 sec<br>$O_2$: 350 sccm<br>$SiH_4$: 160 sccm<br>(sides); 15 sccm (top) | 8 | 7 | 9 | 12 |
| Heat-Up: 45 sec<br>$O_2$: 350 sccm<br>$SiH_4$: 160 sccm<br>(sides); 15 sccm (top) | 40 | 5 | 3 | 20 |
| Heat-Up: 15 sec<br>$O_2$: 290 sccm<br>$SiH_4$: 180 sccm<br>(sides only) | 163 | 10 | 39 | 34 |

As Table 1 shows, the number of particle adders counted on the 200 mm wafers when seasoning films made according to embodiments of the invention are used is, on average, less than the number of the particle adders generated with a conventionally made seasoning film. The reduction in the number of particle adders for seasoning films made according to embodiments of the invention is believed to be due (at least in part) to the superior adhesion characteristics of the film on chamber components made from aluminum nitride.

In Example 2, the number of particles added to a 300 mm wafer from a flaking seasoning layer inside the substrate processing chamber is measured for conventional seasoning films and seasoning films according to embodiments of the invention. For the conventional seasoning film, a seasoning gas is made by flowing 350 sccm of $O_2$, 250 sccm of $SiH_4$, and 250 sccm of Ar (note the $O_2$:$SiH_4$=1.4) into the chamber to maintain a pressure of 40 mTorr. Top and side RF generators were powered to 6000 watts (top) and 2000 watts (sides), respectively, to strike a plasma and deposit the seasoning film on the interior of the chamber.

Following the formation of the conventional seasoning layer, a 300 mm wafer is inserted into the chamber and a deposition step is performed. The substrate deposition includes a deposition gas made by flowing 96 sccm of $O_2$ (from the side nozzles), 13.5 sccm of $SiH_4$ from the top and 55 sccm from side nozzles, and 240 sccm of He from top and 60 sccm from side nozzles. Top and side RF generators were powered to 7000 watts and 4000 watts, respectively, to strike a plasma and the power supplied to bias the substrate was 2700 watts.

For seasoning films formed according to embodiments of the invention, after a heat-up period of 30 seconds, 40 mTorr of seasoning gas is introduced into the chamber, where the seasoning gas is made by flowing 400 sccm of oxygen ($O_2$), 190 sccm of silane ($SiH_4$), and 250 sccm of argon into the chamber from the side positioned AlN nozzles, and 30 sccm more of silane from a top positioned nozzle, making the overall $O_2$:$SiH_4$ ratio 1.63. Top and side RF generators were powered to 6000 watts and 2000 watts, respectively, to strike a plasma and deposit the seasoning film on the interior of the chamber. Following the formation of the seasoning layer, a 300 mm wafer is inserted into the chamber and a deposition step is performed under the conditions described above.

Table 2 summarizes the results of the particle adders found on the 300 mm substrate wafers after the seasoning and substrate deposition steps were performed.

TABLE 2

Particle Adders Found on 300 mm Wafers

| | Particle Adders Counted on 300 mm Wafer | | | | | |
|---|---|---|---|---|---|---|
| | Wafer 1 (1st after clean) | Wafer 9 (1st after clean) | Wafer 21 (1st after clean) | Wafer 22 (2nd after clean) | Wafer 23 (3rd after clean) | Wafer 24 (4th after clean) |
| Conventional Process | 225 | — | — | — | — | — |
| High $O_2$:$SiH_4$ ratio | — | 19 | 15 | 37 | 19 | 9 |

As Table 2 shows, the number of particle adders counted on the wafers when seasoning films made according to embodiments of the invention are used is less than 10% of the particle adders generated with a conventionally made seasoning film. This is an even more significant reduction in particle adders than for the 200 mm wafer experiment described in Example 1. The reduction in the number of particle adders for seasoning films made according to embodiments of the invention is believed to be due (at least in part) to the superior adhesion characteristics of the film on chamber components made from aluminum nitride.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, or groups.

What is claimed is:

1. A method of operating a substrate processing chamber, comprising:
   prior to a substrate processing operation, flowing a seasoning gas comprising silane and oxygen into said chamber at a flow ratio of greater than or equal to about 1.6:1 oxygen to silane to deposit a silicon oxide film over at least one aluminum nitride nozzle exposed to an interior portion of the chamber; and
   adding a substrate to the chamber after the silicon oxide film is deposited on the at least one nozzle.

2. The method of claim 1, wherein prior to the flowing of the seasoning gas the interior portion of the chamber is heated, said heating step comprising:
   flowing a heating gas that includes argon and oxygen into the chamber; and
   striking a plasma from the heating gas with an RF power source, wherein power supplied from the RF power source is about 3000 to about 4000 watts.

3. The method of claim 2, wherein the interior of the chamber is heated for a time of about 30 seconds or more before the flowing of the seasoning gas into the chamber.

4. The method of claim 3, wherein the time for the heating of the chamber is about 30 seconds to about 45 seconds.

5. The method of claim 1, wherein the at least one aluminum nitride nozzle has a peak operating temperature of about 320° C. or less.

6. The method of claim 1, comprising flowing a deposition gas into the chamber to deposit a layer over the substrate.

7. The method of claim 6, wherein the substrate comprises a wafer having a diameter of about 300 mm.

8. The method of claim 7, comprising striking a plasma from the deposition gas with an RF power source, wherein the RF source operates at a peak power of about 7000 watts.

9. The method of claim 1, wherein the seasoning gas comprises a carrier gas selected from the group consisting of argon, helium and hydrogen.

10. The method of claim 1, wherein the silane has a flow rate of about 175 sccm and the oxygen has a flow rate of about 350 sccm.

11. The method of claim 1, comprising cleaning at least one interior surface of said chamber by introducing an etchant gas into said chamber following the substrate processing operation.

12. A method of fabricating an integrated circuit, comprising:
   cleaning at least one interior surface of a substrate processing chamber by introducing an etchant gas into said chamber;
   flowing a seasoning gas comprising oxygen and silane at a flow ratio greater than or equal to 1.6:1 oxygen to silane into the chamber;
   striking a plasma from said seasoning gas to deposit a silicon oxide film over at least one aluminum nitride nozzle exposed to an interior portion of the chamber; and
   transferring, thereafter, a substrate upon which is the integrated circuit is formed into the chamber, and forming a deposited layer on the substrate, wherein the substrate reaches a peak temperature of about 700° C. or more.

13. The method of claim 12, wherein the substrate comprises a wafer having a diameter of about 300 mm.

14. The method of claim 12, wherein the forming of the layer on the substrate comprises using a plasma generation system to strike a second plasma from a deposition gas fed into the chamber through at least one aluminum nitride nozzle, wherein the plasma generation system reaches a peak power of about 7000 watts or more.

15. The method of claim 14, wherein the at least one aluminum nitride nozzle has a peak operating temperature of about 320° C. or less.

16. The method of claim 12, wherein, following the formation of the deposited layer over the substrate, said is contaminated with about 200 particles or less from the silicon oxide film.

17. The method of claim 16, wherein the substrate is contaminated with about 50 particles or less from the silicon oxide film.

* * * * *

UNITED STATES PATENT AND TRADEMARK OFFICE
CERTIFICATE OF CORRECTION

| | |
|---|---|
| PATENT NO. | : 7,109,114 B2 |
| APPLICATION NO. | : 10/841582 |
| DATED | : September 19, 2006 |
| INVENTOR(S) | : Xiaolin Chen et al. |

It is certified that error appears in the above-identified patent and that said Letters Patent is hereby corrected as shown below:

Column 18, claim 12, line 19, delete "is"
Column 18, claim 14, line 29, after "through" insert --the--
Column 18, claim 16, line 37, after "said" insert --substrate--

Signed and Sealed this

Twelfth Day of December, 2006

JON W. DUDAS
*Director of the United States Patent and Trademark Office*